United States Patent
Poplack et al.

(10) Patent No.: US 9,647,688 B1
(45) Date of Patent: May 9, 2017

(54) SYSTEM AND METHOD OF ENCODING IN A SERIALIZER/DESERIALIZER

(71) Applicant: Cadence Design Systems, Inc., San Jose, CA (US)

(72) Inventors: Mitchell G. Poplack, San Jose, CA (US); Simon Sabato, Saratoga, CA (US)

(73) Assignee: CADENCE DESIGN SYSTEMS, INC., San Jose, CA (US)

( * ) Notice: Subject to any disclaimer, the term of this patent is extended or adjusted under 35 U.S.C. 154(b) by 227 days.

(21) Appl. No.: 14/578,100

(22) Filed: Dec. 19, 2014

(51) Int. Cl.
*H03M 13/00* (2006.01)
*H03M 13/03* (2006.01)

(52) U.S. Cl.
CPC .................................. *H03M 13/03* (2013.01)

(58) Field of Classification Search
CPC .................................................. H03M 13/03
See application file for complete search history.

(56) References Cited

U.S. PATENT DOCUMENTS

| | | |
|---|---|---|
| 5,036,473 A | 7/1991 | Butts et al. |
| 5,109,353 A | 4/1992 | Sample et al. |
| 5,425,036 A | 6/1995 | Liu et al. |
| 5,475,830 A | 12/1995 | Chen et al. |
| 5,551,013 A | 8/1996 | Beausoleil et al. |
| 5,960,191 A | 9/1999 | Sample et al. |
| 6,009,256 A | 12/1999 | Tseng et al. |
| 6,035,117 A | 3/2000 | Beausoleil et al. |
| 6,051,030 A | 4/2000 | Beausoleil et al. |
| 6,618,698 B1 | 9/2003 | Beausoleil et al. |
| 7,739,093 B2 | 6/2010 | Beausoleil et al. |
| 8,275,588 B2 | 9/2012 | Cha |
| 9,379,846 B1 | 6/2016 | Poplack et al. |
| 2006/0029100 A1* | 2/2006 | Dove .................... H04L 5/1446 370/474 |

(Continued)

OTHER PUBLICATIONS

Mike Butts; Logic Emulation and Prototyping: It's the Interconnect (Rent rules); RAMP at Stanford; Aug. 2010; 31 pages.

(Continued)

*Primary Examiner* — Sam Rizk
(74) *Attorney, Agent, or Firm* — Arnold & Porter Kaye Scholer LLP

(57) ABSTRACT

A method of encoding a data word in a physical coding sublayer before serial transmission is provided, where data words comprising data bits are received, and the data words encoded using one or more 8B/10B encodings to generate 8B/10B transmission characters. ECC check bits are then generated, and the transmission characters and ECC check bits DC balanced prior to shuffling the bits together to form an encoded word to be transmitted. A receiver may decode by implementing a decode process with error correction. In some embodiments 26 data bits from two 13-bit word are encoded into a 40-bit encoded word. Bits of two or more encoded words may be interleaved for transmission, or multiple copies of encoded words sent. An integrated circuit serializer/deserializer comprises hardware to perform encoding and/or decoding. A hardware functional verification system may also implement the disclosed encoding/decoding for interconnections between emulation chips.

26 Claims, 4 Drawing Sheets

(56) References Cited

U.S. PATENT DOCUMENTS

| | | | |
|---|---|---|---|
| 2007/0299999 A1* | 12/2007 | Duerk | G06F 13/385 |
| | | | 710/105 |
| 2008/0109707 A1* | 5/2008 | Dell | H03M 13/03 |
| | | | 714/776 |
| 2009/0271174 A1 | 10/2009 | Cha | |
| 2011/0099407 A1 | 4/2011 | Jonas | |
| 2011/0182191 A1 | 7/2011 | Jackson | |
| 2011/0264436 A1 | 10/2011 | Ni et al. | |
| 2015/0089289 A1 | 3/2015 | Gahoi et al. | |

OTHER PUBLICATIONS

Charles R. Berghorn, et al.; U.S. Appl. No. 14/920,742, filed Oct. 22, 2015, entitled "System and Method for a Consolidated Emulator to Workstation Connection".

Charles R. Berghorn, et al.; U.S. Appl. No. 14/920,777, filed Oct. 22, 2015, entitled "System and Method for Concurrent Interconnection Diagnostics Field".

Sundar Rajan, et al.; U.S. Appl. No. 14/933,677, filed Nov. 5, 2015 entitled "System for Concurrent Target Diagnostics Field".

Mitchell G. Poplack, et al.; U.S. Appl. No. 15/165,891, filed May 26, 2016 entitled "System and Method of Encoding in a Serializer/Deserializer".

* cited by examiner

SYSTEM AND METHOD OF ENCODING IN A SERIALIZER/DESERIALIZER

FIELD

This patent document relates generally to the field of verifying the functionality of integrated circuit designs prior to fabrication. In particular, the present patent document relates to systems and methods of encoding by a serializer/deserializer of an emulation chip of a hardware functional verification system.

BACKGROUND

Functional verification systems, including hardware emulation systems and simulation acceleration systems, utilize interconnected programmable logic chips or interconnected processor chips. Examples of systems using programmable logic devices are disclosed in, for example, U.S. Pat. No. 6,009,256 entitled "Simulation Emulation System and Method," U.S. Pat. No. 5,109,353 entitled "Apparatus for emulation of electronic hardware system." U.S. Pat. No. 5,036,473 entitled "Method of using electronically reconfigurable logic circuits," U.S. Pat. No. 5,475,830 entitled "Structure and method for providing a reconfigurable emulation circuit without hold time violations," and U.S. Pat. No. 5,960,191 entitled "Emulation system with time-multiplexed interconnect." U.S. Pat. Nos. 6,009,256, 5,109,353, 5,036,473, 5,475,830, and 5,960,191 are incorporated herein by reference. Examples of hardware logic emulation systems using processor chips are disclosed in, for example, U.S. Pat. No. 6,618,698 "Clustered processors in an emulation engine," U.S. Pat. No. 5,551,013 entitled "Multiprocessor for hardware emulation," U.S. Pat. No. 6,035,117 entitled "Tightly coupled emulation processors," U.S. Pat. No. 6,051,030 entitled "Emulation module having planar array organization," and U.S. Pat. No. 7,739,093 entitled "Method of visualization in processor based emulation system." U.S. Pat. Nos. 6,618,698, 5,551,013, 6,035,117, 6,051,030, and 7,739,093 are incorporated herein by reference.

Functional verification systems help to shorten the time it takes to design a customized application specific integrated circuits (ASICs) by allowing designers to emulate the functionality of the ASIC before a production run of the ASIC has begun. Functional verification systems help to ensure ASICs are designed correctly the first time, before a final product is produced.

A particular processor-based hardware functional verification system (sometimes referred to as an "emulator," "emulation system," or the like) may contain numerous emulation chips that transmit data between one another. A serializer/deserializer (SerDes) is typically used to allow a large amount of data to transmit between chips, while minimizing the number of input/output (I/O) pins and interconnects needed by converting data between parallel interconnections within the chip to a serial signal transmitted on the interconnection between chips in each direction. The receiving chip then converts the serial interconnection back into a parallel interconnection.

The serial interconnect may encode the data to be transmitted. Encoding involves transforming the data bits to be transmitted into a new set of bits (or characters) to be transmitted. The number of encoded bits or characters is generally greater than the number of original data bits for a given word. Such encoding may be desired to reduce the DC component, also known as disparity or bias, of the transmitted signal, or add or modify bits for various transmission purposes, including synchronization, clock recovery, word alignment, error correction, error mitigation, tracking, or routing.

One encoding technique is known as 8B/10B as described for example in U.S. Pat. No. 4,486,739, which is hereby incorporated by reference in its entirety. 8B/10B is typically a line code where each eight-bit data byte is converted to a 10-bit transmission character to achieve DC-balance and bounded disparity, while providing enough state changes to allow for reasonable clock recovery.

Although the present methods of encoding are useful to a degree, there still exists a need in the field for reduced latency, reduced error, and conservative serial streams. Thus, for at least these reasons there is a need for an improved method and system for encoding by a serializer/deserializer of an emulation chip of a hardware functional verification system.

SUMMARY

Systems and methods for encoding by a serializer/deserializer in an integrated circuit, including in an emulation chip of a hardware functional verification system, are disclosed and claimed herein.

One general aspect includes a method of encoding data in a serializer/deserializer device of an integrated circuit, including receiving a plurality of data words at the serializer/deserializer device. The method also includes encoding a plurality of data bits of the plurality of data words using one or more 8B/10B encoders to generate a plurality of 8B/10B transmission characters. The method also includes generating a plurality of error correction code (ECC) check bits from the plurality of 8B/10B transmission characters based on a contents of an ECC table stored in a memory or a plurality of registers. The method also includes DC balancing the plurality of 8B/10B transmission characters and the plurality of ECC check bits. The method also includes shuffling an order of the plurality of 8B/10B transmission characters and the plurality of ECC check bits to form an encoded word. The method also includes serially transmitting the encoded word from a transmitter of the integrated circuit.

Implementations may include one or more of the following features. The method may be performed where the encoded word includes forty bits, and where the plurality of data words includes twenty-six data bits. The method may be performed where the forty bits includes of thirty transmission characters, seven ECC check bits, two data bits of the plurality of data bits, and one invert bit. The method may be performed where the plurality of data words includes twenty-six data bits, and where encoding a plurality of data bits of the plurality of data words using one or more 8B/10B encodings to generate a plurality of transmission characters includes: encoding a first eight of the twenty-six data bits using an 8B/10B encoding to generate a first encoded ten bits; encoding a second eight of the twenty-six data bits using an 8B/10B encoding to generate a second encoded ten bits; and encoding a third eight of the twenty-six data bits using an 8B/10B encoding to generate a third encoded ten bits. The method may be performed where DC balancing the plurality of transmission characters and the plurality of ECC check bits includes: tracking a running disparity of previously-encoded words, where the running disparity has a sign; calculating a disparity of the plurality of transmission characters and the plurality ECC check bits, where the disparity has a sign; and inverting a bit value of an invert bit if the sign of the disparity matches the sign of the running disparity. The method may also include inverting the plurality of 8B/10B transmission characters and the plurality of ECC check bits if the sign of the disparity matches the sign of the running disparity. The method may be performed where each ECC check bit of the plurality of ECC check bits is at least three bit positions for another other ECC check bit in the encoded word. The method may be performed where the plurality of ECC check bits are generated from less than all the plurality of 8B/10B transmission characters. The method may further include serially transmitting a second encoded word from the transmitter, where each bit of a plurality of bits of the second encoded word is interleaved with each bit of the encoded word during transmission. The method may further include serially transmitting a copy of the encoded word from the transmitter immediately following the encoded word. The method may also further include serially transmitting a second encoded word from the transmitter immediately following the encoded word; serially transmitting a copy of the encoded word from the transmitter immediately following the second encoded word; and serially transmitting a copy of the second encoded word from the transmitter immediately following the copy of the encoded word.

One general aspect includes an integrated circuit serializer/deserializer, including: a communications interface to receive a plurality of data words at the integrated circuit serializer/deserializer, where each data word includes a plurality of data bits. The integrated circuit serializer/deserializer also includes one or more 8B/10B encoding blocks to encode the plurality of data bits into a plurality of 8B/10B transmission characters. The integrated circuit serializer/deserializer also includes an error correction code (ECC) encoder to generate a plurality of ECC check bits from the plurality of 8B/10B transmission characters based on a contents of an ECC table stored in a memory or a plurality of registers. The integrated circuit serializer/deserializer also includes a DC balancer that inverts the plurality of 8B/10B transmission characters and the plurality of ECC check bits if a sign of a disparity of the plurality of 8B/10B transmission characters and the plurality of ECC check bits matches a sign of a running disparity for previously-encoded words. The integrated circuit serializer/deserializer also includes a shuffler that reorders the plurality of 8B/10B transmission characters and the plurality of ECC check bits into an encoded word. The integrated circuit serializer/deserializer also includes a serializer to serialize the encoded word.

Implementations may include one or more of the following features. The integrated circuit serializer/deserializer may be such that the one or more 8B/10B encoding blocks to encode the plurality of data bits into the plurality of 8B/10B transmission characters includes three 8B/10B encoding blocks to encode twenty-four data bits of two data words, each 8B/10B encoding block encoding eight data bits of the twenty-four data bits into ten transmission characters according to an 8B/10B encoding. The integrated circuit serializer/deserializer may further include an interleaving stage coupled to the shuffler to interleave each bit of the encoded word with each bit of a second encoded word. The integrated circuit serializer/deserializer may further include a copying stage coupled to the shuffler to copy the encoded word and provide the copy of the encoded word to the serializer following the encoded word. The integrated circuit serializer/deserializer may be such that the copying stage provides a second encoded word to the serializer immediately following the encoded word, provides the copy of the encoded word to the serializer immediately following the second encoded word, and provides a second copy of the encoded word to the serializer immediately following the copy of the encoded word.

One general aspect includes a hardware functional verification system, including a plurality of interconnected emulation chips, including a first emulation chip. The emulation chip includes a plurality of emulation processors. The emulation chip also includes an encoder to encode a plurality of data words received from the plurality of emulation processors, the plurality of data words including emulation data generated by the plurality of emulation processors, where the encoder outputs an encoded plurality of data words, and where the encoder includes: one or more 8B/10B encoding blocks to encode the emulation data into a plurality of 8B/10B transmission characters; an error correction code (ECC) encoder to generate a plurality of ECC check bits from the plurality of 8B/10B transmission characters based on a contents of an ECC table stored in a memory or a plurality of registers; a DC balancer to balance a disparity of the plurality of 8B/10B transmission characters and the plurality of ECC check bits with a running disparity for a plurality of previously-encoded words; and a shuffler that reorders the plurality of 8B/10B transmission characters and the plurality of ECC check bits into an encoded word. The emulation chip also includes a serializer to converts a parallel signal representing the encoded plurality of data words into a serial bitstream of encoded words. The emulation chip also includes a transmitter to transmit the serial bitstream of encoded words from the first emulation chip to a second emulation chip of the hardware functional verification system.

Implementations may include one or more of the following features. The hardware functional verification system may be such that the DC balancer inverts the plurality of 8B/10B transmission characters and the plurality of ECC check bits if a sign of the disparity of the plurality of 8B/10B transmission characters and the plurality of ECC check bits matches a sign of a running disparity for the plurality of previously-encoded words. The hardware functional verification system may be such that the encoder further includes an interleaving stage coupled to the shuffler to interleave each bit of the encoded word with each bit of a second encoded word. The hardware functional verification system may be such that the encoder further includes a copying stage coupled to the shuffler to copy the encoded word and provide the copy of the encoded word to the serializer following the encoded word.

A system of one or more computers can be configured to perform particular operations or actions by virtue of having software, firmware, hardware, or a combination of them installed on the system that in operation causes or cause the system to perform the actions. One or more computer programs can be configured to perform particular operations or actions by virtue of including instructions that, when executed by data processing apparatus, cause the apparatus to perform the actions. Implementations of the described techniques may include hardware, a method or process, or computer software on a computer-accessible medium.

These and other objects, features, aspects, and advantages of the embodiments will become better understood with reference to the following description and accompanying drawings.

BRIEF DESCRIPTION OF THE DRAWINGS

The accompanying drawings, which are included as part of the present specification, illustrate the presently preferred embodiments and together with the general description given above and the detailed description of the preferred embodiments given below serve to explain and teach the principles described herein.

Figure 1:
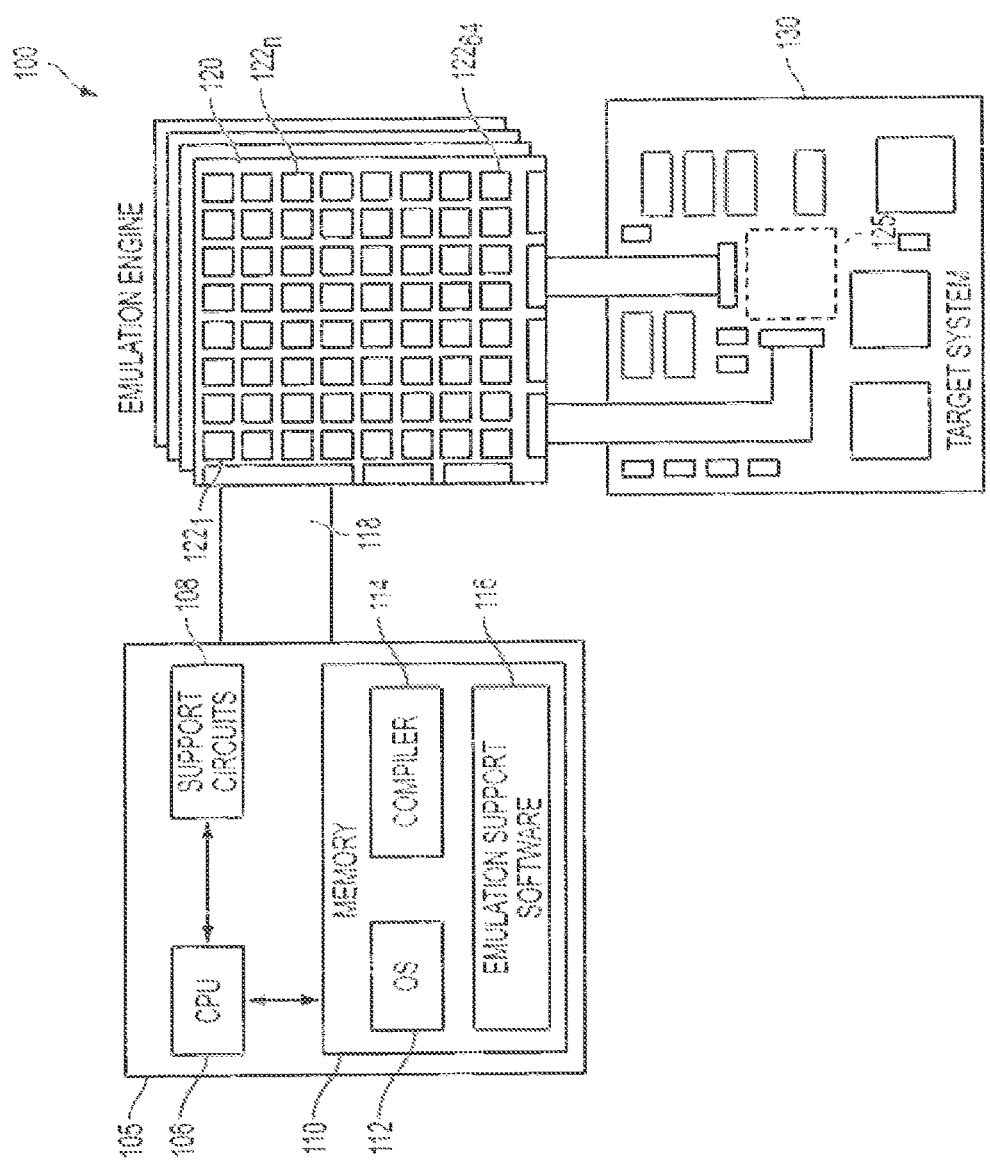
FIG. 1 illustrates an overview of one embodiment of a processor-based emulation system 100.

The figures are not necessarily drawn to scale and the elements of similar structures or functions are generally represented by like reference numerals for illustrative purposes throughout the figures. The figures are only intended to facilitate the description of the various embodiments described herein; the figures do not describe every aspect of the teachings disclosed herein and do not limit the scope of the claims.

DETAILED DESCRIPTION

A method and apparatus for encoding by a serializer/deserializer in an integrated circuit included in an emulation chip of a hardware functional verification system is disclosed. Each of the features and teachings disclosed herein can be utilized separately or in conjunction with other features and teachings. Representative examples utilizing many of these additional features and teachings, both separately and in combination, are described in further detail with reference to the attached drawings. This detailed description is merely intended to teach a person of skill in the art further details for practicing preferred aspects of the present teachings and is not intended to limit the scope of the claims. Therefore, combinations of features disclosed in the following detailed description may not be necessary to practice the teachings in the broadest sense, and are instead taught merely to describe particularly representative examples of the present teachings.

In the following description, for purposes of explanation only, specific nomenclature is set forth to provide a thorough understanding of the various embodiments described herein. However, it will be apparent to one skilled in the art that these specific details are not required to practice the concepts described herein.

Some portions of the detailed descriptions that follow are presented in terms of algorithms and symbolic representations of operations on data bits within a computer memory. These algorithmic descriptions and representations are the means used by those skilled in the data processing arts to most effectively convey the substance of their work to others skilled in the art. An algorithm may be here, and generally, conceived to be a self-consistent sequence of steps leading to a desired result. The steps may be those requiring physical manipulations of physical quantities. Usually, though not necessarily, these quantities take the form of electrical or magnetic signals capable of being stored, transferred, combined, compared, and otherwise manipulated. It has proven convenient at times, principally for reasons of common usage, to refer to these signals as bits, values, elements, symbols, characters, terms, numbers, or the like. It should be borne in mind, however, that all of these and similar terms are to be associated with the appropriate physical quantities and are merely convenient labels applied to these quantities. Unless specifically stated otherwise as apparent from the following discussion, it is appreciated that throughout the description, discussions utilizing terms such as "processing" or "computing" or "calculating" or "determining" or "displaying" or the like, refer to the action and processes of a computer system, or similar electronic computing device, that manipulates and transforms data represented as physical (electronic) quantities within the computer system's registers and memories into other data similarly represented as physical quantities within the computer system memories or registers or other such information storage, transmission or display devices.

Also disclosed is an apparatus for performing the operations herein. This apparatus may be specially constructed for the required purposes, or it may comprise a general purpose computer selectively activated or reconfigured by a computer program stored in the computer. Such a computer program may be stored in a computer readable storage medium, such as, but is not limited to, any type of disk, including floppy disks, optical disks, CD-ROMs, and magnetic-optical disks, read-only memories (ROMs), random access memories (RAMs), erasable programmable read-only memories (EPROMs), electrically erasable programmable read-only memories (EEPROMs), magnetic or optical cards, or any type of media suitable for storing electronic instructions, and each coupled to a computer system bus.

Any algorithms that may be presented herein are not inherently related to any particular computer or other apparatus. Various general purpose systems may be used with programs in accordance with the teachings herein, or it may prove convenient to construct a more specialized apparatus to perform the required method steps. The required structure for a variety of these systems will appear from the description below. It will be appreciated that a variety of programming languages may be used to implement the present teachings.

Moreover, the various features of the representative examples and the dependent claims may be combined in ways that are not specifically and explicitly enumerated in order to provide additional useful embodiments of the present teachings. It is also expressly noted that all value ranges or indications of groups of entities disclose every possible intermediate value or intermediate entity for the purpose of original disclosure, as well as for the purpose of restricting the claimed subject matter. It is also expressly noted that the dimensions and the shapes of the components shown in the figures are designed to help to understand how the present teachings are practiced, but not intended to limit the dimensions and the shapes shown in the examples.

FIG. 1 illustrates an overview of an embodiment of a processor-based emulation system 100. The system comprises a host or computer workstation 105, an emulation engine including at least one emulation board 120, and a target system 130. While a processor-based emulation engine is described, though other emulation engines, such as those utilizing arrays of programmable logic devices (such as FPGAs) may also be used, for example properly-configured versions of the systems discussed above.

The host workstation 105 provides emulation support facilities to the emulation engine 100 and emulation board 120. The host workstation 105, for example a personal computer, may comprise at least one central processing unit (CPU) 106, support circuits 108, and a memory 110. The CPU 106 may comprise one or more conventionally available microprocessors and/or microcontrollers. The support circuits 108 may be well known circuits that are used to support the operation of the CPU 106. These supporting circuits may comprise power supplies, clocks, input/output interface circuitry, cache, and other similar circuits.

Memory 110, sometimes referred to as main memory, may comprise random access memory, read only memory, disk memory, flash memory, optical storage, and/or various combinations of these types of memory. Memory 110 may in part be used as cache memory or buffer memory. Memory 110 may store various forms of software and files for the emulation system, such as an operating system (OS) 112, a compiler 114, and emulation support software 116.

The compiler 114 converts a hardware design, such as hardware described in VHDL or Verilog programming language, to a sequence of instructions that can be evaluated by the emulation board 120.

The host workstation 105 allows a user to interface with the emulation engine 100 via communications channel 118, including emulation board 120, and control the emulation process and collect emulation results for analysis. Under control of the host workstation 105, programming information and data is loaded to the emulation engine 100. The emulation board 120 has on it a number of individual emulation chips, for example the sixty-four emulation chips $122_1$ to $122_{64}$ (collectively 122) shown in FIG. 1, in addition to miscellaneous support circuitry. There may be any number of emulation chips. The emulation chips 122 are designed to mimic the functionality of any synchronous ASIC design using programmable logic. This is done in order for chip designers to prototype their ASIC design using processor based emulation before having actual silicon in hand. Communication between emulation chips 122 is established via serial I/Os links. There may be numerous output lanes per emulation chip 122. Some of the I/Os links may remain on the card on copper. For longer connections to other cards, the signals may be relayed through optical transceivers and cables.

In response to programming received from the emulation support software 116, emulation engine 100 emulates a portion 125 of the target system 130. Portion 125 of the target system 130 may be an integrated circuit, a memory, a processor, or any other object or device that may be emulated in a programming language. Exemplary emulation programming languages include Verilog and VHDL.

Figure 2:
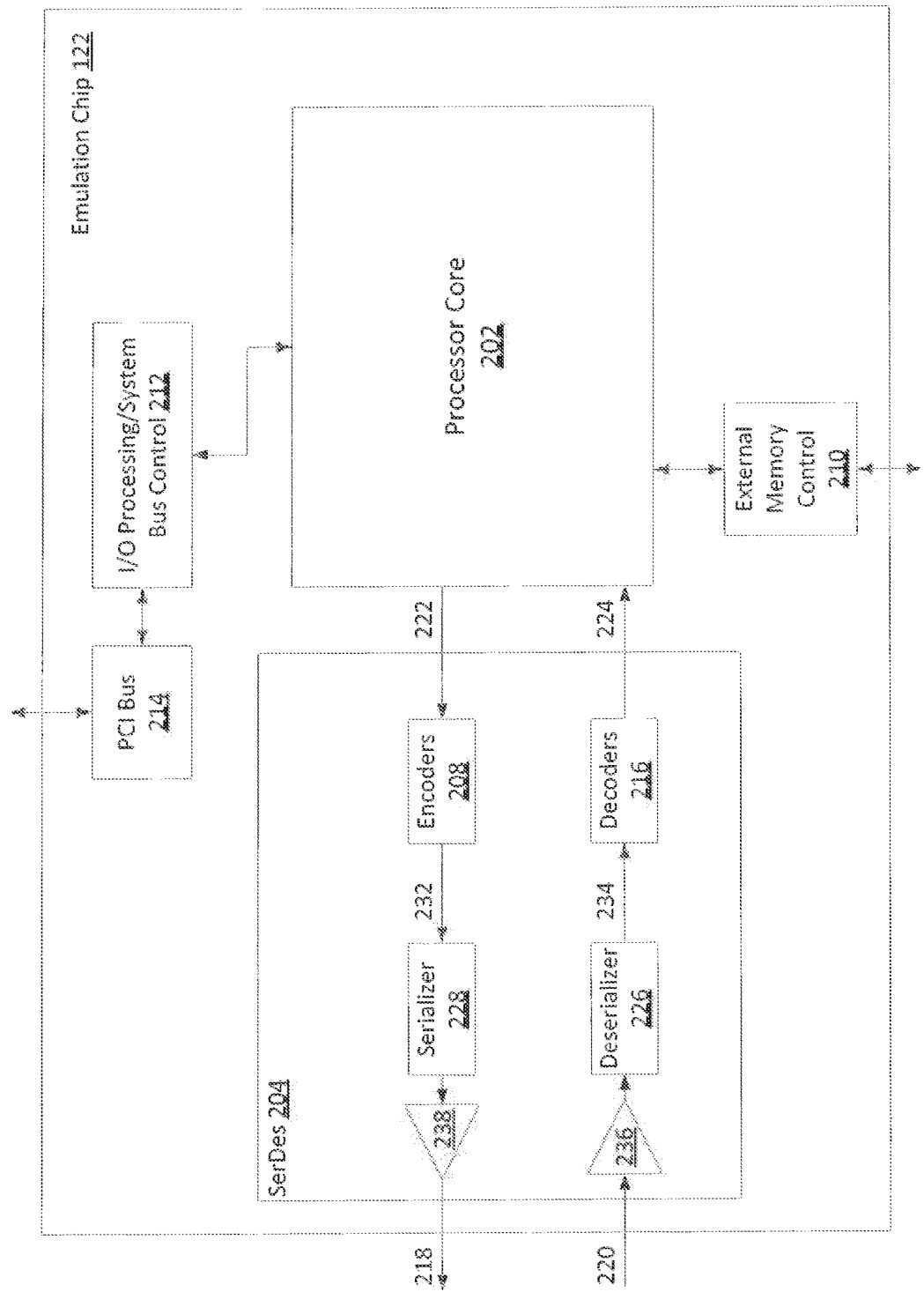
FIG. 2 illustrates a block diagram of one embodiment of an emulation chip of a hardware functional verification system.

FIG. 2 illustrates a block diagram of one embodiment of an emulation chip of a hardware functional verification system. The device of FIG. 2 is an embodiment of one of the emulation chips $122_1$ to $122_{64}$ (collectively 122) shown in FIG. 1. An emulation chip 122 has a processor core 202 where instructions are carried out, such as instructions for emulation of a circuit design, the processor core including emulation processors arranged in a hierarchy of processor clusters, embedded memory, interconnect, and communications and other emulation support circuitry. The I/O processing/system bus control 212 controls the peripheral component interconnect (PCI) bus 214. The PCI bus may also be a general I/O bus. In other embodiments, the PCI bus may be a PCI bus with higher speed than a standard PCI bus. During the emulation process, the processor core 202 may send processed data to or received processed data from the SerDes 204. SerDes 204 may include components that may be considered part of a physical coding sublayer (or PCS) logic. The SerDes 204 contains the encoders 208. The encoders 208 encode the data according to a selected mode. The encoded data is then serialized by serializer 228 prior to transmission by transmitter 238 on output link 218 to another emulation chips 122 of the system, or other destinations. The SerDes 204 also deserializes incoming data from other emulation chips 122 on input link 220 received at receiver 236 using deserializer 226, and decodes the data with decoders 216. The emulator chips 122 may also contain an external memory control 210 in communication with the processor 202. The parallel data interfaces of the SerDes are typically synchronous to the main on-chip clock. Typically, the SerDes 204, encoders 208, and decoders 216 may be implemented with hardware. In other embodiments, the SerDes 204, encoders 208, and decoders 216 may also be implemented with software.

FIG. 2 illustrates a single SerDes 204. However, the SerDes 204 in physical implementation may comprise multiple serializer/deserializer blocks that may perform the encoding and decoding described in the present disclosure in parallel for a number of different interconnections. For example, it is contemplated that a typical hardware functional verification system may have many thousands or even millions of such interconnections. Encoding and the corresponding decoding (on a different emulation chip) may also be customized to a particular serializer/deserializer block, such that the encoding and decoding modes used for a particular interconnection may be different, even between the same set of emulation chips.

In other contexts where a SerDes is implemented, a hardware developer is typically concerned about maximizing throughput or bandwidth, i.e. to provide the maximum rate to data transmission across an interface that is possible. In such applications, error correction may be used to correct errors introduced by the SerDes during parallel to serial data conversion or during transmission of the serialized data. Such error correction schemes may introduce significant latency dating correction. However, in typical SerDes applications, there is little concern for the amount of latency that may be introduced in the serial stream for a particular transmitted packet when performing error correction. In the context of a hardware functional verification system (emulator) that runs synchronously, however, the system typically lacks ability to retransmit packets that have errors that cannot be corrected after receipt because various components of the system run synchronously. Thus, while it is still desirable to minimize latency, it is also desirable to maximize transmission accuracy to provide an ultra-low bit error rate (BER). While the context of an emulator is discussed below, the disclosed techniques may be used in various technological contexts and implementations, especially where maximum transmission accuracy (low BER) is desired and low latency is also needed.

According to an embodiment, the encoders 208 of the SerDes 204 encode data words to be transmitters on output link 218 using a number of different encoding stages.

Figure 3:
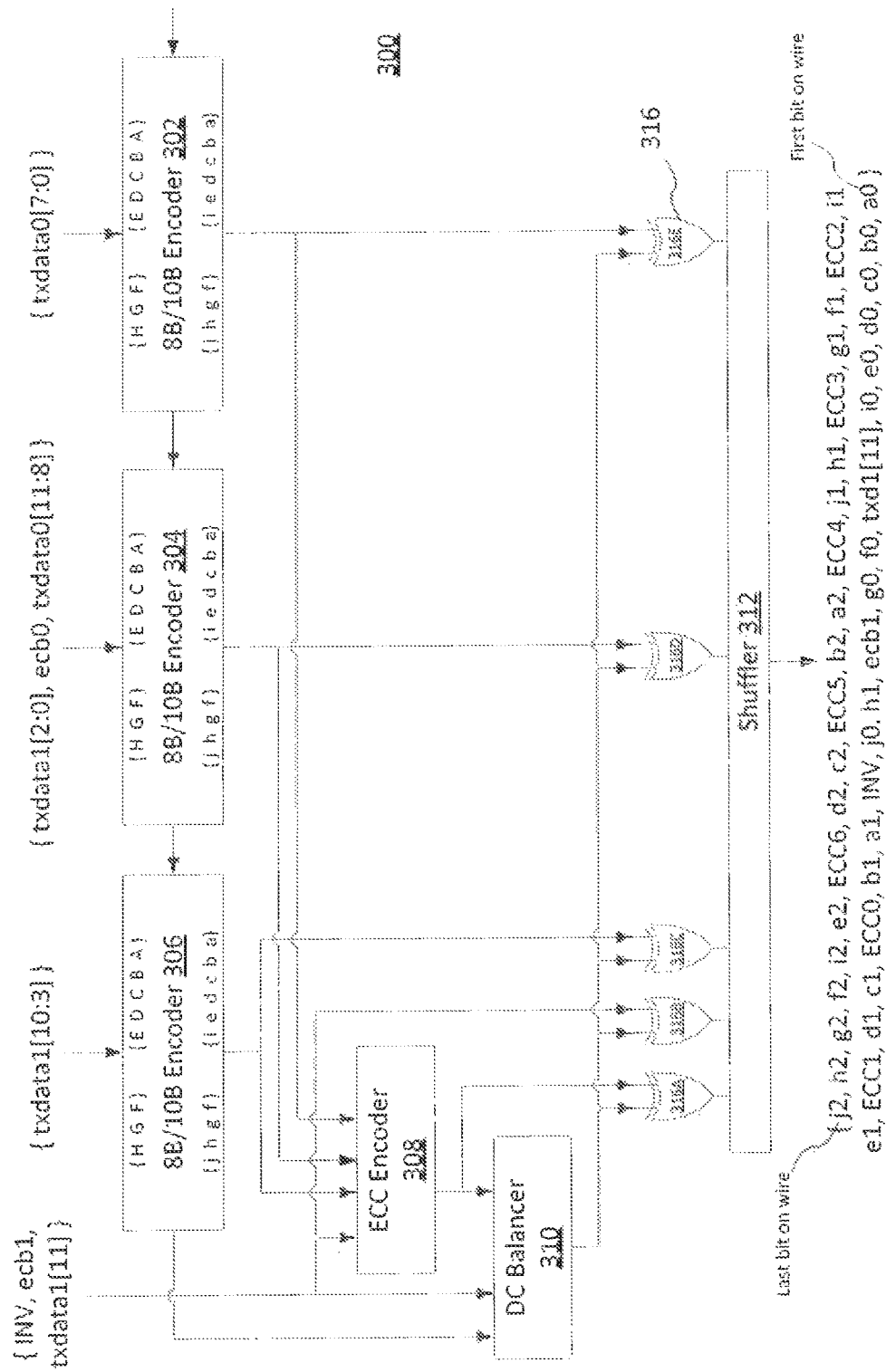
FIG. 3 illustrates the encoding blocks of a 26B/40B encoder with the flow of bits during encoding.

In another embodiment, an alternate mode for the serializer/deserializer, a variant of 8B/10B-type encoding may be used by the serializer/deserializer in a "26B/40B" mode, though it is to be understood that the "26B/40B" name is not a limitation, and the mode may also be referred to by other names. FIG. 3 illustrates one embodiment of a 26B/40B mode 300. The 26B/40B mode may maintain improved error tolerance over other encoding modes, but may trade some latency for a more conservative serial stream. The 26B/40B mode may use ECC, DC balancing, and shuffling stages, together with a variation of 8B/10B encoding. Having the majority of the data on the wire encoded with 8B/10B may ensure that the transition density, DC balance, and run-lengths may be acceptable.

The disclosed 26B/40B mode uses a variant of a standard 8B/10B line code. 8B/10B encoding has been previously described in Widmer, Al X. and Peter A. Franaszek, *A DC-Balanced, Partitioned-Block, 8B/10B Transmission*

Code, IBM JOURNAL OF RESEARCH AND DEVELOPMENT, Volume 27, Number 5, Page 440 (1983), and U.S. Pat. No. 4,486,739, each of which is hereby incorporated by reference in their entirety. The 26B/40B mode may have improved line characteristics over 8B/10B, at the cost of an extra cycle of latency at both ends of the link. The 26B/40B mode essentially takes the data of two cycles (26 bits), then applies ECC encoding in block 308 and DC balancing in block 310. The ECC encoder block 308, DC balancer block 310, and shuffler block 312 may be in the SerDes core 204. Shuffling in block 312 then mixes the ECC bits with the 8B/10B encoded data.

SerDes core 204 receives thirteen-bit data words over interconnect 222. These data words include twelve data bits (txdata [11:0]) plus an error correction (ECB) bit (ecb) in FIG. 3. In the 26B/40B mode, two such data words are encoded at a time. A first 8B/10B encoder 302 encodes the first eight data bits of a first data word (txdata0[7:0]) to generate a first encoded ten bits. A second 8B/10B encoder 304 encodes the last four data bits of the first data word (txdata0[11:8]), the first ECB bit ecb0, and the first three bits of the second data word (txdata1[2:0]) to generate a second encoded ten bits. A third 8B/10B encoder 306 encodes a middle eight data bits of the second data word (txdata1[10:3]) to generate a third encoded ten bits. The last data bit of the second data word (txdata1[11]) and the second ECB bit ecb1 are not 8B/10B encoded. In addition, an invert bit (INV) is added, where INV initially has a bit value of "0" that may be switched during the encoding process.

Seven ECC bits ECC[6:0] are then generated from these thirty-three bits (30 encoded, 2 not encoded, and the invert bit INV) by ECC encode block 308 according to an ECC table that may be stored in a memory or registers, or used by the HDL implementation of the encoder, and therefore implemented with synthesized logic gates. The ECC bits are then added to the thirty-three bit word to create a forty-bit word. A representative ECC table that provides for such functionality according to the embodiment is shown in Table 1 below.

TABLE 1

| ECC BIT | 13 | 12 | 11 | 10 | 9 | 8 | 7 | 6 | 5 | 4 | 3 | 2 | 1 | 0 |
|---|---|---|---|---|---|---|---|---|---|---|---|---|---|---|
| 5 | X | X | X | X | X | X | X |   |   |   |   |   |   |   |
| 4 | X | X | X | X |   |   |   | X | X | X |   |   |   |   |
| 3 | X |   |   |   | X | X | X |   |   |   | X | X | X |   |
| 2 |   | X |   |   |   | X |   |   | X | X |   | X | X |   |
| 1 |   |   | X |   |   |   | X |   |   | X |   | X | X |   | X | X |
| 0 |   |   |   | X |   |   |   | X |   |   | X | X |   | X | X | X |

In Table 1, the columns represent bits in data to encode while the rows represent the resulting error correction bits. The error correction is done using addition modulo 2, i.e., with an exclusive or function. Thus, for example, if the data to be transmitted is "00000000000001," then ECC=000111, as shown in the right-hand "0" column. In another example, if the data to be transmitted is "00000000000010," then ECC=001011, as seen in column "1." In yet another example, if the data to be transmitted is "00000000000011," then ECC=000111 (column "0")⊕001011 (column "1"), which results in 001000.

Following ECC bit generation, the DC balancer 310 operates on the forty-bit word to invert the bit of the word, or not, based on the results of a comparison of the disparity of the current forty-bit word and the running disparity. The DC balancer stage of encoding ensures that the physically transmitted data is DC-balanced over medium and long time scales, that the transition density is about 50% statistically. A DC balanced data stream typically has an equal number of 0's and 1's in the data stream over sufficiently long sequences.

In a DC balancing stage of the 26B/40B mode, the DC balancing operates by monitoring the running disparity of the transmitted data and inverts a word being encoded when a word's disparity and the running disparity have the same sign; this is possible in part because the error correcting code is chosen such that inverting the data inverts the check bits. The disparity of a word is the difference between the number of 1s and the number of 0s. If a word has eleven 1's and nine 0's, the disparity of that word is +2. If there are fewer 1's than 0's, the disparity has a negative sign. Of course, the selection of signs is arbitrary as long as it is consistently used in the encoding, and the sign used could be reversed in another embodiment. The running disparity is the difference in the total number of 1's and 0's over time, counted after inversion, if any, of a word. A goal of DC balancing is to keep the running disparity near zero over sufficiently long sequences.

First, the disparity of the current word is calculated. The disparity of the word is then compared against the running disparity to determine whether they have the same sign, i.e. whether both disparities are positive, whether both disparities are negative. If the sign is the same, then the current data word is inverted. Because the invert bit was set to a value of "0" when it was prepended to the data word, inversion gives the invert bit a value of "1", which will indicate at the receiver of the encoded that the word has been inverted (so that the decoder on the receiver side may again invert the word to restore it). If the sign of the disparity of the word and the running disparity are different, then the word is not inverted. Either if inverted or not, the next step is to shuffle the word at shuffler 312.

In 26B/40B mode, the K input (which would cause the encoder to generate a control character) may be deactivated, so that only data bits are transmitted. As shown in FIG. 3, the running disparity may be calculated between 8B/10B encoder blocks 302, 304, and 306. The running disparity may also be calculated at the end of a cycle. The running disparity from the last cycle may also be input to the next cycle. The 8B/10 B encoders may assume a starting negative disparity, and may signal either negative or neutral disparity to the DC balancer. The DC balancer 310 may look at the bypass and INV bits, and the running disparity from the 8B/10B conversion. However, the majority of data bits may not be examined, since 8B/10B summarizes the results of its own DC balancing via its running disparity output.

If the DC balancer determines that the disparity of the current forty-bit word and the disparity have the same sign, the DC balancer outputs a "1" bit value, and the XOR circuitry 318 (not all XOR gates are shown) will flip the values of each bit of the encoded word, including the invert bit INV, which after inversion, would have a bit value of "1". If the disparities have different signs, the DC balancer outputs and "0", thus not causing an inversion of bits.

The order of the bits in the DC-balanced forty-bit word is then shuffled by the shuffler block 312. Shuffling may reduce the average and maximum run length of the serial data by breaking up long runs in the input data with ECC bits. The shuffle order as seen in FIG. 3 was chosen to minimize worst-case run-length. In other embodiments, other shuffle orders may be used, which may provide other benefits or also seek to minimize worst-case run-length. In other embodiments, the shuffle order may also be reversed, such that the last bit is transmitter first and the first bit is transmitted last.

After shuffling, the bits are shuffled to be arranged as illustrated by the encoded forty-bit word 314 in FIG. 3. The thirty bits encoded using 8B/10B encoding are a0, b0, c0, . . . , j2. The seven ECC bits are ECC[6:0], the one unencoded data bit is txd_1[11], the one unencoded ECB bit is ecb_1, and the one invert bit is INV.

The shuffled bits are serialized for transmission over transmission line 218 from the emulation chip 122. After serialization, 8B/10B encoded bit a0 is the first bit on the line, and j2 is the last bit on the line. The order may also be reversed according to another embodiment.

In 26B/40B mode, there are typically six bits of 8B/10B encoded data on either side of the forty-bit encoded word, which is essentially a double word because two input data words are encoded into one word to be transmitted. This ensures transitions at the beginning and end of each double-word, so that adjacent double-words do not combine. The data stream 314 may contain forty bits 316, where typically only twenty-four bits are 8B/10B encoded, while two bits may bypass 8B/10B encoding.

Figure 4:
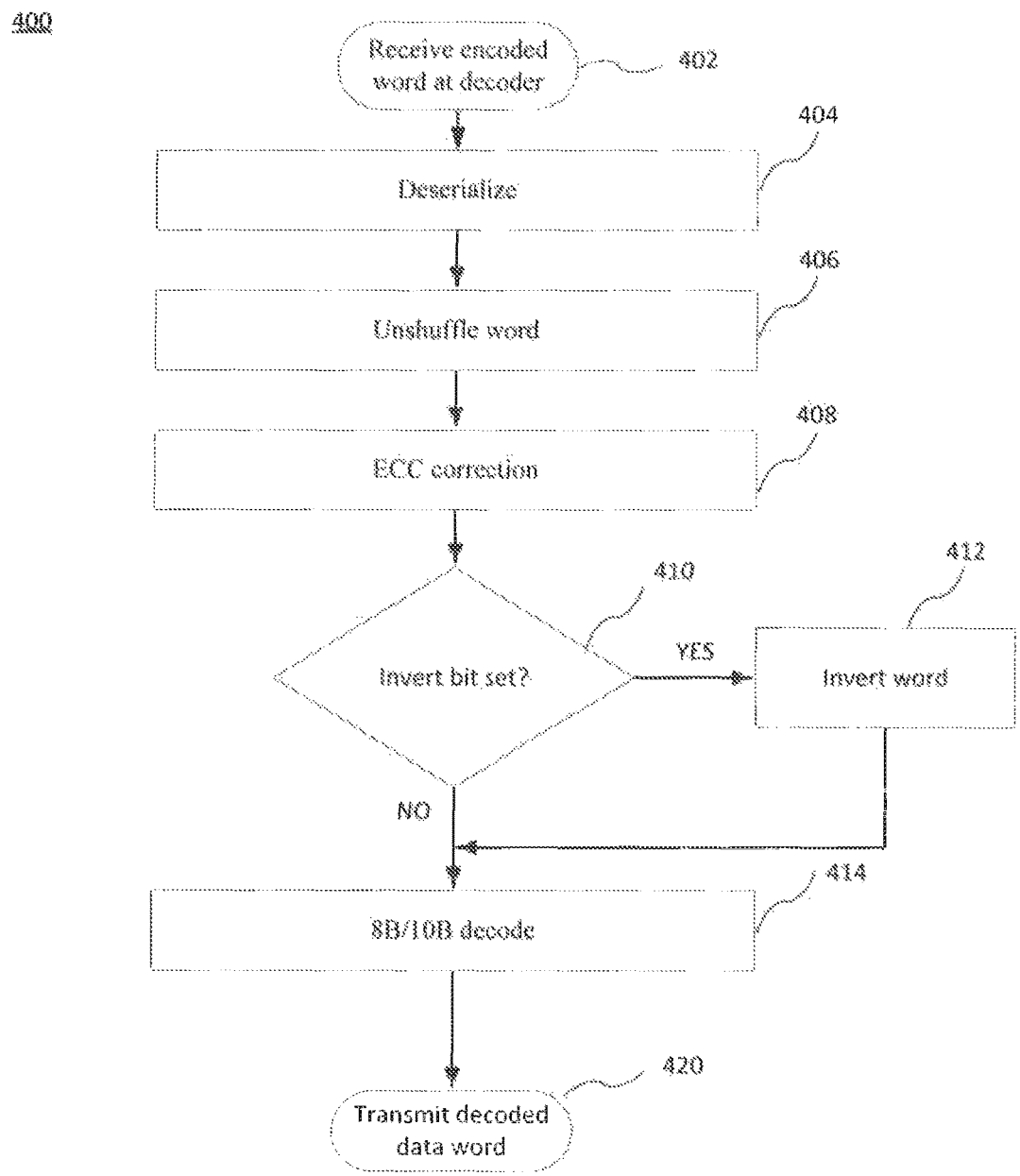
FIG. 4 illustrates a flow for decoding data words encoded according to a 26B/40B encoding mode.

On the receiver side of a transmission, the decoding process for the 26B/40B mode follows the flow of FIG. 4. First, at block 402 the encoded word (which is an encoded double-word, i.e. two encoded sets of 13 data bits) is received at a 26B/40B decoder, for example received over serial interconnect 220 to decoder 208. At step 404 the serial data is deserialized then unshuffled in step 406. The unshuffling takes a word whose bits are shuffled as illustrated in bit arrangement 314 of FIG. 3 and puts the bits back in their original bit positions within the word. An ECC reversal algorithm is applied in step 408. The algorithm checks the seven ECC check bits and data (including the 8B/10B encoded data, the bypassed bits, and the invert bit), and can correct single-bit errors. According to another embodiment, where there has been a single-bit error correction, a single-bit error correction flag may be output. Double-bit errors may be detected, although not corrected, and a double-bit error detection flag output. After ECC correction, and ECC bit discard, time thirty-three bits remain in the double data word.

At step 410, the decoder checks whether the invert bit has been set, i.e. if it has a value of "1" and discards the invert bit. If yes, then the double data word is inverted at step 412 and the flow proceeds to block 414. If the invert bit has not been set, then there is no inversion and the flow proceeds to block 414. Whether inverted or not, thirty-two bits remain in the double data word.

At this point, the bypassed bits, ecb1 and txdata1[11] are unencoded. For the bits still encoded according to 8B/10B the first ten encoded bits are decoded into a first decoded eight bits, the second ten encoded bits are decoded into a second decoded eight bits, and the third ten encoded bits are decoded into a first decoded eight bits, all at block 414. There are then twenty-six decoded comprising a first data word and a second data word. Those two words may then be transmitted from the decoder 208 in the SerDes core 204 via decoder output 224 towards its destination at step 420.

The serializer/deserializer may have multiple alternate modes in addition to the 26B/40B mode discussed above. These further embodiments use the same 26B/40B encoding described above, but add the alternate modes to increase the bit-error rate of the system. The interleave mode or the copy mode described below may be performed after encoding the data word but prior to serialization for transmission. On the decoding side, the alternate modes would be undone after deserialization of the received word, but prior to the beginning of the rest of the decoding steps.

One alternate mode for the serializer/deserializer may be an interleaving mode. An interleave mode may trade an increased latency for an increase in error tolerance. Interleaving may be used in digital communication systems generally to improve the performance of error correcting codes. In some cases, errors occur in bursts across more than one bit rather than independently in individual nonsequential bits. For example, in the case of small burst errors, interleaving several data words together can spread a burst error across several words, thereby improving the error correcting codes capability of recovering the particular words that were affected by the errors. In an interleaving mode, the encoding process may be the same as the default mode, but including words that are interleaved after encoding, but before serialization, within the serializer/deserializer 204. One way of interleaving the bits of the words is by taking the first bit [0] of a first word (word0), followed by a first bit [0] of a second word (word1), followed by a third bit [2] of the first word (word 0), followed by the third bit [2] of the second word (word1), with the second bits of each word added later, as shown for example by the bit stream: (word0[0], word1[0], word0[2], word1[2] . . . word0[1], word1[1] . . . ), this interleave mode may be referred to as Interleave-2. As shown in the bit stream above, the second bit [1] of first word (word0), and the second bit [1] of second word (word[1]) can be interleaved at any point later in the bit stream. In another interleave mode, the bits of the words may be interleaved as: (word0[0], word1[0], word2[0], word3[0], word0[4], word1[4] . . . ), this interleave mode may be referred to as Interleave-4. In Interleave-4 as shown above, word3 may be a fourth word. Also it is noted that [4] denotes a fifth bit of a word, such as the fifth bit of a first word (word0) by word0[4].

On the receiver side, the interleaved encoded words may be de-interleaved by performing the inverse algorithm alter deserialization, for example by deserializer 226, but prior to the decoding process of decoders 216.

Another alternate mode for the serializer/deserializer may be a copying mode. A copying mode may send a word multiple times. Like interleaving, copying may be performed after encoding by encoder 208, but prior to serialization by serializer 228. This may result in reduced bandwidth as well as increased latency, but also an increase in the tolerance for very long error bursts. In a copying mode, which may also be referred to herein as a type of interleaving, the encoding process ignores data for half the incoming words, and instead sends a copy of a word (from 1 word ago, 2 words ago, or 4 words ago, depending on the mode). At the receiver, both copies are checked for valid ECC, and if one word in error the other word will then be chosen. One copy mode, which may be referred to as "Copy 1" mode, sends a first word "word0," then a copy of the same word "word0," followed by a third word "word2," followed by a copy of the third word "word2" again as seen in the stream: word0, word0, word2, word2, word4 . . . ). A second copy mode, which may be referred to as "Copy 2" mode, may be shown in the stream (word0, word1, word0, word1, word4, word5, word4, word5 . . . ). Another copy mode, which may be referred to as "Copy 4" mode, may be shown in the stream (word0, word1, word2, word3, word0, word1, word2, word3, word8, word9 . . . ). Copy modes may indicate three different types of error—single error correct (SEC), double error detect (DED), and ERR (which is flagged when a DED error occurs on both copies of to data word). Copy modes trade both latency and bandwidth for a large increase in error tolerance.

On the receiver side, where the error correction circuit detects an error in one copy, it looks to the other copy or copies of data to see if there are errors in that copy or copies. If both copies, for example for a Copy 2 mode, contain two or more errors there will there be uncorrectable errors in the received encoded data, but as long as one or more copies of the encoded data have no errors or a single error, then the encoded word will be valid or valid after correction of the single error.

Although the embodiments have been described with reference to the drawings and specific examples, it will readily be appreciated by those skilled in the art that many modifications and adaptations of the apparatuses and processes described herein are possible without departure from the spirit and scope of the embodiments as claimed hereinafter. Thus, it is to be clearly understood that this description is made only by way of example and not as a limitation on the scope of the claims.

We claim:

1. A method of encoding data in a serializer/deserializer device of an integrated circuit for transmitting data from a first emulation chip to a second emulation chip, the first emulation chip and the second emulation chip emulating a portion of an integrated circuit design, comprising:
   receiving a plurality of data words from a plurality of emulation processors on the first emulation chip at the serializer/deserializer device;
   encoding a plurality of data bits of the plurality of data words using one or more 8B/10B encoders to generate a plurality of 8B/10B transmission characters;
   generating a plurality of error correction code (ECC) check bits from the plurality of 8B/10B transmission characters based on a contents of an ECC table;
   DC balancing the plurality of 8B/10B transmission characters and the plurality of ECC check bits;
   shuffling an order of the plurality of 8B/10B transmission characters and the plurality of ECC check bits to form an encoded word; and
   serially transmitting the encoded word from a transmitter of the integrated circuit.

2. The method of claim 1, wherein the encoded word comprises forty bits, and wherein the plurality of data words comprises twenty-six data bits.

3. The method of claim 2, wherein the forty bits consists of thirty transmission characters, seven ECC check bits, two data bits of the plurality of data bits, and one invert bit.

4. The method of claim 1, wherein the plurality of data words comprises twenty-six data bits, and wherein encoding a plurality of data bits of the plurality of data words using one or more 8B/10B encodings to generate a plurality of transmission characters comprises:
   encoding a first eight of the twenty-six data bits using an 8B/10B encoding to generate a first encoded ten bits;
   encoding a second eight of the twenty-six data bits using an 8B/10B encoding to generate a second encoded ten bits; and
   encoding a third eight of the twenty-six data bits using an 8B/10B encoding to generate a third encoded ten bits.

5. The method of claim 1, wherein DC balancing the plurality of transmission characters and the plurality of ECC check bits comprises:
   tracking a running disparity of previously-encoded words, wherein the running disparity has a sign;
   calculating a disparity of the plurality of transmission characters and the plurality ECC check bits, wherein the disparity has a sign; and
   inverting a bit value of an invert bit if the sign of the disparity matches the sign of the running disparity.

6. The method of claim 5, further comprising:
   inverting the plurality of 8B/10B transmission characters and the plurality of ECC check bits if the sign of the disparity matches the sign of the running disparity.

7. The method of claim 1, wherein each ECC check bit of the plurality of ECC check bits is at least three bit positions for another other ECC check bit in the encoded word.

8. The method of claim 1, wherein the plurality of ECC check bits are generated from less than all the plurality of 8B/10B transmission characters.

9. The method of claim 1, further comprising:
   serially transmitting a second encoded word from the transmitter, wherein each bit of a plurality of bits of the second encoded word is interleaved with each bit of the encoded word during transmission.

10. The method of claim 1, further comprising:
    serially transmitting a copy of the encoded word from the transmitter immediately following the encoded word.

11. The method of claim 1, further comprising:
    serially transmitting a second encoded word from the transmitter immediately following the encoded word;
    serially transmitting a copy of the encoded word from the transmitter immediately following the second encoded word; and
    serially transmitting a copy of the second encoded word from the transmitter immediately following the copy of the encoded word.

12. The method of claim 1, wherein the ECC table is stored in a memory or a plurality of registers.

13. The method of claim 1, wherein the ECC table is synthesized into logic gates.

14. An integrated circuit serializer/deserializer for transmitting data from a first emulation chip to a second emulation chip, the first emulation chip and the second emulation chip emulating a portion of an integrated circuit design, comprising:
    a communications interface to receive a plurality of data words from a plurality of emulation processors on the first emulation chip at the integrated circuit serializer/deserializer, wherein each data word comprises a plurality of data bits;
    one or more 8B/10B encoding blocks to encode the plurality of data bits into a plurality of 8B/10B transmission characters;
    an error correction code (ECC) encoder to generate a plurality of ECC check bits from the plurality of 8B/10B transmission characters based on a contents of an ECC table;
    a DC balancer that inverts the plurality of 8B/10B transmission characters and the plurality of ECC check bits if a sign of a disparity of the plurality of 8B/10B transmission characters and the plurality of ECC check bits matches a sign of a running disparity for previously-encoded words;
    a shuffler that reorders the plurality of 8B/10B transmission characters and the plurality of ECC check bits into an encoded word; and
    a serializer to serialize the encoded word.

15. The integrated circuit serializer/deserializer of claim 14, wherein the one or more 8B/10B encoding blocks to encode the plurality of data bits into the plurality of 8B/10B transmission characters comprises three 8B/10B encoding blocks to encode twenty-four data bits of two data words, each 8B/10B encoding block encoding eight data bits of the twenty-four data bits into ten transmission characters according to an 8B/10B encoding.

16. The integrated circuit serializer/deserializer of claim 14, further comprising an interleaving stage coupled to the shuffler to interleave each bit of the encoded word with each bit of a second encoded word.

17. The integrated circuit serializer/deserializer of claim 14, further comprising a copying stage coupled to the shuffler to copy the encoded word and provide the copy of the encoded word to the serializer following the encoded word.

18. The integrated circuit serializer/deserializer of claim 17, wherein the copying stage provides a second encoded word to the serializer immediately following the encoded word, provides the copy of the encoded word to the serializer immediately following the second encoded word, and provides a second copy of the encoded word to the serializer immediately following the copy of the encoded word.

19. The method of claim 14, wherein the ECC table is stored in a memory or a plurality of registers.

20. The method of claim 14, wherein the ECC table is synthesized into logic gates.

21. A hardware functional verification system, comprising:
- a plurality of interconnected emulation chips, each of the plurality of interconnected emulation chips emulating a portion of an integrated circuit design, a first emulation chip comprising:
  - a plurality of emulation processors;
  - an encoder to encode a plurality of data words received from the plurality of emulation processors, the plurality of data words including emulation data generated by the plurality of emulation processors, wherein the encoder outputs an encoded plurality of data words, and wherein the encoder comprises:
    - one or more 8B/10B encoding blocks to encode the emulation data into a plurality of 8B/10B transmission characters;
    - an error correction code (ECC) encoder to generate a plurality of ECC check bits from the plurality of 8B/10B transmission characters based on a contents of an ECC table;
    - a DC balancer to balance a disparity of the plurality of 8B/10B transmission characters and the plurality of ECC check bits with a running disparity for a plurality of previously-encoded words; and
    - a shuffler that reorders the plurality of 8B/10B transmission characters and the plurality of ECC check bits into an encoded word;
  - a serializer to converts a parallel signal representing the encoded plurality of data words into a serial bitstream of encoded words; and
  - a transmitter to transmit the serial bitstream of encoded words from the first emulation chip to a second emulation chip of the hardware functional verification system.

22. The hardware functional verification system of claim 21, wherein the DC balancer inverts the plurality of 8B/10B transmission characters and the plurality of ECC check bits if a sign of the disparity of the plurality of 8B/10B transmission characters and the plurality of ECC check bits matches a sign of a running disparity for the plurality of previously-encoded words.

23. The hardware functional verification system of claim 21, wherein the encoder further comprises an interleaving stage coupled to the shuffler to interleave each bit of the encoded word with each bit of a second encoded word.

24. The hardware functional verification system of claim 21, wherein the encoder further comprises a copying stage coupled to the shuffler to copy the encoded word and provide the copy of the encoded word to the serializer following the encoded word.

25. The method of claim 21, wherein the ECC table is stored in a memory or a plurality of registers.

26. The method of claim 21, wherein the ECC table is synthesized into logic gates.

* * * * *